United States Patent [19]
Roitman et al.

[11] Patent Number: 5,629,389
[45] Date of Patent: May 13, 1997

[54] POLYMER-BASED ELECTROLUMINESCENT DEVICE WITH IMPROVED STABILITY

[75] Inventors: Daniel B. Roitman, Menlo Park; James R. Sheats; Mark R. Hueschen, both of Palo Alto, all of Calif.

[73] Assignee: Hewlett-Packard Company, Palo Alto, Calif.

[21] Appl. No.: 463,141

[22] Filed: Jun. 6, 1995

[51] Int. Cl.$^6$ .................. C08F 283/00; H01B 1/00; H01L 27/15; H01L 31/12
[52] U.S. Cl. .................. 525/534; 525/540; 362/800; 257/80; 257/83; 252/500
[58] Field of Search .................. 525/534, 540; 362/800; 257/80, 83; 252/500

[56] References Cited

U.S. PATENT DOCUMENTS

| | | | |
|---|---|---|---|
| 5,401,827 | 3/1995 | Holmes et al. | 528/374 |
| 5,424,560 | 6/1995 | Norman et al. | 257/40 |
| 5,504,323 | 4/1996 | Heeger et al. | 250/214.1 |

OTHER PUBLICATIONS

Synthetic Metals: "Plastic LED: A Flexible Light–Emitting Device Using a Polyaniline Transparent Electrode"; Gustafsson et al. Apr. 1993.

Electric Vehicles: "Conducting Polymers Could Lead to Lightweight Plastic Batteries for EVs"; Battery & EV Technology, Business Communications Company, Inc. Jul. 1992.

*Primary Examiner*—Terrel Morris

[57] ABSTRACT

An improved electroluminescent device which includes a hole injection electrode, an electron injection electrode, and an electroluminescent layer located between the hole and electron injection electrodes. The electroluminescent layer includes an organic polymer and a hindered phenolic additive in a concentration greater than 4% by weight. The preferred organic polymer is a derivative of PPV. The preferred hindered phenolic additives are and 2,4,6 tri-tert-butyl phenol 2,6 di-tert-butyl-methylphenol. The device has higher efficiency and a slower rate of degradation than devices lacking the hindered phenolic additive.

5 Claims, 1 Drawing Sheet

POLYMER-BASED ELECTROLUMINESCENT DEVICE WITH IMPROVED STABILITY

FIELD OF THE INVENTION

The present invention relates to electroluminescent devices, and more particularly, to light emitting devices based on organic polymers.

BACKGROUND OF THE INVENTION

Polymer-based electroluminescent devices (PLEDs) have the potential for providing inexpensive alternatives to LEDs. PLEDs may be fabricated by coating the appropriate surfaces with the organic polymer, and hence, do not require the use of high cost fabrication systems such as those utilized in the fabrication of semiconductor devices. A simple PLED may be constructed from an electroluminescent layer sandwiched between an electron injection electrode and a hole injection electrode. More complicated devices utilize electron and hole transport layers between the above mentioned electrodes and the electroluminescent layer.

Unfortunately, the lifetimes obtained with current PLEDs are not sufficient to allow commercially useful devices. One of the most critical issues in organic electroluminescent devices is the decrease of performance (light output and efficiency) as a function of accumulated time of operation. While many strategies have been proposed and implemented to extend the useful lifetime of luminescent devices none of these strategies has resulted in devices with commercially attractive lifetimes.

Broadly, it is the object of the present invention to provide an improved PLED.

It is a further object of the present invention to provide a PLED with increased lifetime relative to prior art PLEDs.

These and other objects of the present invention will become apparent to those skilled in the art from the following detailed description of the invention and the accompanying drawings.

SUMMARY OF THE INVENTION

The present invention is an improved electroluminescent device which includes a hole injection electrode, an electron injection electrode, and an electroluminescent layer located between the hole and electron injection electrodes. The electroluminescent layer includes an organic polymer and a hindered phenolic additive in a concentration greater than 4% by weight. The preferred organic polymer is Poly[2,5-bis (5,6-dihydrocholestanoxy)-1,4-phenylene vinylene), abbreviated BCHA-PPV]. The preferred hindered phenolic additive are 2,6 di-tert-butyl-4-methylphenol(mp=70° C.) and 2,4,6 tri-tert-butyl phenol (mp=130° C.).

DETAILED DESCRIPTION OF THE INVENTION

Figure 1:
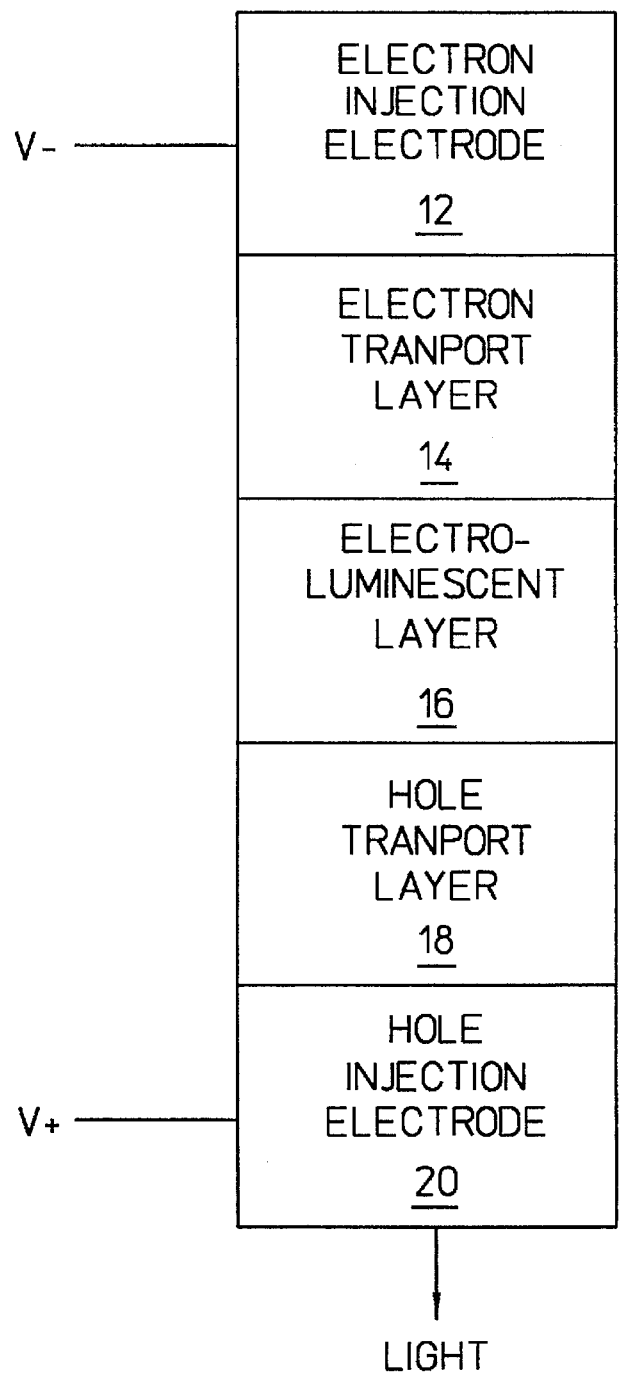
FIG. 1 is a cross-sectional view of a PLED according to the present invention.

The present invention may be more easily understood with reference to FIG. 1 which is a cross-sectional view of a PLED 10. PLED 10 includes an electron injection electrode 12 (the cathode), an electron transport layer 14, an electroluminescent layer 16, a hole transport layer 18, and finally a hole injection electrode 20. The electron transport and hole transport layers are usually designed to facilitate charge transport and assist charge balance to optimize charge recombination in the electroluminescent layer. The anode is typically a transparent electrode, such as a layer of indium tin-oxide on top of a transparent support (glass or plastic). The cathode is a typically a vapor deposited metal, preferably with a work-function closely matching the energy level of the electron transport layer. It should be noted that the electron transport and hole transport layers are optional. The most commonly used polymeric materials for the electroluminescent layer are derrivatives of p-phenylene vinylene such as Poly[2-dicholestanoxy-p-phenylenevinylene] (BCHA-PPV) and poly (2-methoxy-5-(2'-ethylhexoxy)-1,4-phenylene vinylene) (MEHPPV).

The present invention is based on the addition of hindered phenolic additives (HPAs) to the electroluminescent layer; however, it will be apparent to those skilled in the art from the following discussion that it may be advantageous to incorporate HPAs in each layer of the PLED shown in FIG. 1. The preferred HPA is 2,6 di-tert-butyl-methylphenol (DBMP) and 2,4,6 tri-tert-butyl phenol (TBP). The initial efficiencies of the devices containing 40% DBMP were more than fourfold higher than devices without DBMP. In addition, the rate of performance decline under operating conditions were several fold slower for devices containing DBMP than for devices fabricated without DBMP.

The electroluminescent layer may be fabricated by spin casting (ca 4,000 to 6,000 rpm) solutions of BCHA-PPV (MW~900,000, with formula weight FW=874 per repeat unit) in xylenes and chlorobenzene (ca 1% to 2% concentration). The HPA 2,6-di-tert-butyl-4methylphenol (MW=220) may be added to the polymer solutions by thoroughly dissolving the HPA before film spin casting. Solutions containing HPA-to-polymer ratios between 0.18 and 2 (corresponding to 4.5% to 50% moles of HPA per polymer repeat unit) have been prepared.

It should be noted that the addition of small amounts of HPA to structural polymers to stabilize those polymers is known to the art. However, in contrast to the present invention, the amounts of HPA used for structural stabilization is quite low (of the order of 0.1%). The HPAs are typically added to the polymers to arrest the extent of polymer degradation during processing (such as melt extrusion).

The preferred percentage of HPA to the polymers for electroluminescent films depends, in general, on the specific polymer; however, concentrations in the range of 20 to 50% provide improvements in the lifetime and/or efficiency of the PLED.

While the above embodiments of the present invention have utilized DBMP, other HPAs may be advantageously utilized. For example, TBP and 2-(2H-benzotriazol-2-yl)-4, 6-bis(1-methyl-1-phenylethyl)phenol which is sold commericially as Ciba Geigy "TINUVIN 234 may be used in place of DBMP.

Various modifications to the present invention will become apparent to those skilled in the art from the foregoing description and accompanying drawings. Accordingly, the present invention is to be limited solely by the scope of the following claims.

What is claimed is:

1. An electroluminescent device comprising:

a hole injection electrode;

an electron injection electrode; and an electroluminescent layer comprising an organic polymer between said hole and electron injection electrodes, said electroluminescent layer further comprising a hindered phenolic additive in a concentration greater than 4% by weight, wherein said hindered phenolic additive is chosen from the group consisting of 2,6 di-tert-butyl-methylphenol, 2-(2H-benzotriazol-2-yl)-4,6-bis(1-methyl-1-phenylethyl)phenol, or 2,4,6 tri-butyl phenol.

2. The electroluminescent device of claim 1 wherein said electroluminescent layer comprises Poly (2,5-bis (5,6-dihydrocholestanoxy)-1,4-phenylene vinylene) or poly (2-methoxy-5-(2-'ethyl-hexoxy)-1,4-phenylene vinylene).

3. The electroluminescent device of claim 1 further comprising an electron transport layer between said electron injection electrode and said electroluminescent layer.

4. The electroluminescent device of claim 1 further comprising a hole transport layer between said hole injection electrode and said electroluminescent layer.

5. An electroluminescent material comprising Poly(2,5-bis(5,6-dihydrocholestanoxy)-1,4-phenylene vinylene), and poly(2-methoxy- 5-(2-'ethyl-hexoxy)-1,4-phenylene vinylene) in combination with a hindered phenolic additive, wherein said hindered phenolic additive is chosen from the group consisting of 2,6 di-tert-butylmethylphenol, 2-(2H-benzotriazol-2-yl)-4,6-bis(1-methyl-1-phenylethyl)phenol, or 2,4,6 tri-tert-butyl phenol.

* * * * *